United States Patent
Yang et al.

(10) Patent No.: US 8,279,703 B2
(45) Date of Patent: Oct. 2, 2012

(54) SUB-WORD LINE DRIVER CIRCUIT AND SEMICONDUCTOR MEMORY DEVICE HAVING THE SAME

(75) Inventors: Hyang-Ja Yang, Suwon-si (KR); Jeong-Soo Park, Yongin-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 254 days.

(21) Appl. No.: 12/839,454

(22) Filed: Jul. 20, 2010

(65) Prior Publication Data

US 2011/0032786 A1 Feb. 10, 2011

(30) Foreign Application Priority Data

Aug. 10, 2009 (KR) ........................ 10-2009-0073207

(51) Int. Cl.
*G11C 8/00* (2006.01)
*H01L 29/76* (2006.01)
*H01L 21/70* (2006.01)

(52) U.S. Cl. .............. 365/230.06; 365/230.08; 257/288; 257/368

(58) Field of Classification Search .............. 365/230.06
See application file for complete search history.

(56) References Cited

U.S. PATENT DOCUMENTS

| 4,651,183 | A * | 3/1987 | Lange et al. ................. 257/296 |
| 7,432,143 | B2 * | 10/2008 | Cho et al. ................... 438/176 |
| 7,745,899 | B2 * | 6/2010 | Oh et al. ..................... 257/435 |
| 7,842,981 | B2 * | 11/2010 | Lee et al. .................... 257/249 |
| 2008/0079040 | A1 * | 4/2008 | Nam ............................ 257/288 |
| 2011/0266597 | A1 * | 11/2011 | Kim ............................ 257/288 |

FOREIGN PATENT DOCUMENTS

| JP | 2005-116654 | 4/2005 |
| KR | 1020060085567 A | 7/2006 |
| KR | 1020060131334 A | 12/2006 |
| KR | 1020070078567 A | 8/2007 |

* cited by examiner

*Primary Examiner* — Son Mai

(74) *Attorney, Agent, or Firm* — Muir Patent Consulting, PLLC

(57) ABSTRACT

A sub-word line driver includes a substrate, a plurality of gate lines and at least one gate tab. The substrate includes a plurality of isolation areas and a plurality of active areas, where the two active areas are separated by each isolation area, and the isolation areas and the active areas are extended in a first direction and are arranged in a second direction perpendicular to the first direction. The plurality of gate lines are formed on the substrate, where the gate lines are extended in a second direction and are arranged in the first direction. The at least one gate tab is formed on the substrate, where the at least one gate tab is extended in the first direction to cover the isolation area. Incorrect operation of the sub-word line driver may be prevented, and a power consumption of the sub-word line driver may be reduced.

13 Claims, 7 Drawing Sheets

SUB-WORD LINE DRIVER CIRCUIT AND SEMICONDUCTOR MEMORY DEVICE HAVING THE SAME

CROSS-REFERENCE TO RELATED APPLICATION(S)

This application claims priority under 35 USC §119 to Korean Patent Application No. 2009-0073207, filed on Aug. 10, 2009, in the Korean Intellectual Property Office (KIPO), the contents of which are incorporated herein in its entirety by reference.

BACKGROUND

1. Technical Field

Example embodiments relate to a semiconductor memory device, and more particularly to a layout of a sub-word line driver circuit and a semiconductor memory device having a sub-word line driver circuit.

2. Description of the Related Art

Semiconductor memory devices are configured to store data into and read data from memory cells connected to word lines and bit lines. Memory cells connected to one word line are selected simultaneously based on a word line voltage that is applied to the one word line.

As storage capacity of a semiconductor memory device increases, more memory cells are connected to one word line and thus a current-driving capacity of a word line driver needs to be increased. When the current-driving capacity of the word line driver is limited, a delay in driving a selected word line connected to a relatively large number of memory cells becomes serious. To solve problems due to such delay, a word line may be divided into a plurality of sub-word lines, and the plurality of the sub-word lines may be driven by sub-word line drivers (SWD), respectively.

A sub-word line driver provides a sub-word line with a boost voltage having a higher level than a power supply voltage to select a relatively small number of memory cells connected to one sub-word line. The boost voltage is applied to a pull-up transistor such as a p-type metal oxide semiconductor (PMOS) included in the sub-word line driver. When the pull-up transistor operates repeatedly based on the boost voltage having a high voltage level, degradation such as a hot electron induced punch through (HEIP) may be caused and a standby current may be increased, thereby degrading a reliability of the sub-word line driver.

SUMMARY

Some example embodiments provide a sub-word line driver circuit capable of increasing an effective channel length of transistors included in the sub-word line driver circuit.

Some example embodiments provide a semiconductor memory device including a sub-word line driver circuit capable of increasing an effective channel length of transistors included in the sub-word line driver circuit.

According to example embodiments, a sub-word line driver circuit includes a substrate, a plurality of gate lines and at least one gate tab. The substrate includes a plurality of isolation areas and a plurality of active areas, where the two consecutive active areas are separated by each isolation area, and the isolation areas and the active areas are extended in a first direction and are arranged in a second direction perpendicular to the first direction. The plurality of gate lines are formed on the substrate, where the gate lines are extended in the second direction and are arranged in the first direction. The at least one gate tab is formed on the substrate, where the at least one gate tab is extended in the first direction to cover the isolation area.

The at least one gate tab may be enlarged in the second direction to further cover a boundary portion of the active area, where the boundary portion is adjacent to the isolation area.

The gate lines may include a first gate line and a second gate line that are arranged consecutively in the first direction, where the first gate line and the second gate line receive a gate voltage simultaneously. The at least one gate tab may be formed to cover all of the isolation area between the first gate line and the second gate line.

The at least one gate tab may be enlarged in the second direction to further cover a boundary portion of the active area between the first gate line and the second gate line, where the boundary portion is adjacent to the isolation area.

The at least one gate tab may include a plurality of gate tabs that are arranged in the second direction, where each gate tab covers each isolation area between the first gate line and the second gate line.

The first gate line and the second gate line may form a ring structure such that each end of the first gate line and the second gate line are extended on the isolation areas in the first direction to be connected to each other.

The gate lines may include a first gate line, a second gate line, a third gate line and a fourth gate line that are arranged consecutively in the first direction, where the first gate line and the second gate line receive a first gate voltage simultaneously and the third gate line and the fourth gate line receive a second gate voltage simultaneously. The at least one gate tab may include a first gate tab and a second gate tab, where the first gate tab is formed to cover all of the isolation area between the first gate line and the second gate line, and the second gate tab is formed to cover all of the isolation area between the third gate line and the fourth gate line.

The first gate tab and the second gate tab may be enlarged in the second direction to further cover boundary portions of the active areas between the first gate line and the second gate line and between the third gate line and the fourth gate line, where the boundary portions are adjacent to the isolation areas.

Each of the first gate tab and the second gate tab may include a plurality of gate tabs that are arranged consecutively in the second direction, where each gate tab covers each isolation area between the first gate line and the second gate line and between the third gate line and the fourth gate line.

The first gate tab and the second gate tab may be arranged to be spaced apart from each other in the first direction.

The first gate line and the second gate line may form a ring structure such that each end of the first gate line and the second gate line are extended on the isolation areas in the first direction to be connected to each other, and third gate line and the fourth gate line may form a ring structure such that each end of the third gate line and the fourth gate line are extended on the isolation areas in the first direction to be connected to each other.

A source region and a drain region may be formed in the active area, a sub-word line drive signal may be applied to the source region, a word line enable signal may be applied to the gate line, and the drain region may be connected to a sub-word line.

According to example embodiments, a semiconductor memory device includes a sub-word line driver and a memory cell array. The sub-word line driver provides a sub-word line with a sub-word line drive signal in response to a word line enable signal. The sub-word line driver includes a substrate, a plurality of gate lines and at least one gate tab. The substrate includes a plurality of isolation areas and a plurality of active areas, where the two consecutive active areas are separated by each isolation area, and the isolation areas and the active areas are extended in a first direction and are arranged in a second direction perpendicular to the first direction. The plurality of gate lines are formed on the substrate, where the gate lines are extended in the second direction and are arranged in the first direction. The at least one gate tab is formed on the substrate, where the at least one gate tab is extended in the first direction to cover the isolation area. The memory cell array includes a plurality of memory cells, where each of the plurality of the memory cells is connected to the sub-word line and a bit line.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
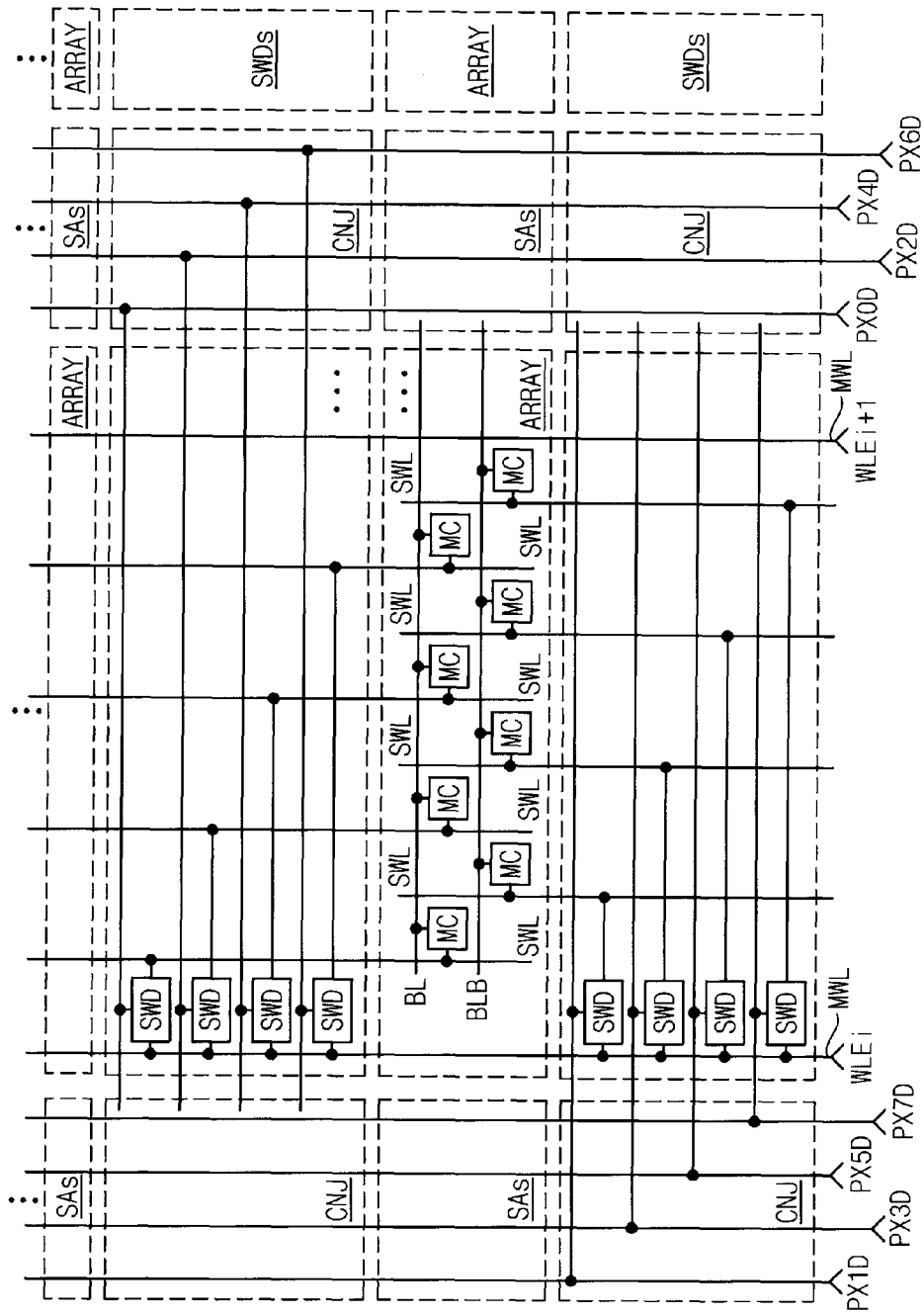
FIG. 1 is a diagram illustrating a semiconductor memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a semiconductor memory device according to example embodiments.

Referring to FIG. 1, a semiconductor memory device includes a memory cell array area ARRAY, a sense amplifier area SAs, a sub-word line driver area SWDs and a conjunction area CNJ.

The memory cell array area ARRAY includes a plurality of memory cells MC connected to a corresponding sub-word line SWL and one of a bit line BL and a complementary bit line BLB. Since the memory cells MC are connected to sub-word line drivers SWD, respectively, the memory cells MC operate based on a word line enable signal WLEi and a sub-word line drive signal PXjD. The word line enable signal WLEi applied to a respective main word line MWL may be activated based on a first bit of a row address. The sub-word line drive signal PXjD applied to the respective sub-word line SWL may be activated based on a second bit of the row address to read data from and write data into the memory cells MC connected to the sub-word line SWL that is selected based on the word line enable signal WLEi and the sub-word line drive signal PXjD.

Since the main word line MWL is divided into a plurality of sub-word lines SWL, a delay due to insufficient current-driving capacity of a main word line driver may be decreased.

The memory cell MC may have a different structure according to types of a semiconductor memory device. For example, when a semiconductor memory device is a dynamic random access memory (DRAM), each memory cell MC may include at least one transistor and a capacitor. The at least one transistor may be connected to a sub-word line SWL and a bit line. The capacitor may be charged or discharged by a voltage level of the bit line in response to a signal applied to the sub-word line SWL. The semiconductor memory device may further include a refresh circuit that maintains a voltage level of the capacitor since charges stored in the capacitor may be self-discharged.

When the memory cell MC has a structure of a DRAM, the semiconductor memory device may be a pseudo static random access memory (PSRAM). A PSRAM is a semiconductor memory device that operates similar to a static random access memory SRAM even though a memory cell has a structure of a DRAM. A PSRAM may be referred to as a unit transistor random access memory (UtRAM) since each memory cell includes one transistor and one capacitor.

A plurality of sub-word line drivers SWD may be formed in each sub-word line driver area SWDs. In example embodiments of FIG. 1, eight sub-word line drivers SWD are controlled by one word line enable signal WLEi. The number of sub-word line drivers SWD controlled by one word line enable signal WLEi may be changed in other example embodiments. Each of the sub-word line drivers SWD receives the word line enable signal WLEi and the corresponding sub-word line drive signal PXjD, and provides the corresponding sub-word line SWL with the corresponding sub-word line drive signal PXjD based on the word line enable signal WLEi.

The word line enable signal WLEi and the sub-word line drive signal PXjD, which are provided to the sub-word line driver SWD, may be activated based on a row address. The sub-word line driver SWD may provide the sub-word line SWL with the sub-word line drive signal PXjD in response to the word line enable signal WLEi. An activated sub-word line drive signal PXjD may have a voltage level of a boost voltage VPP that is in the highest level among internal voltages used in the semiconductor memory device. When the sub-word line driver SWD operates repeatedly based on the boost voltage VPP of a relatively high level, a reliability of the sub-word line driver SWD may be decreased because of degradation.

To reduce degradation of the sub-word line driver SWD, a gate tab may be formed to be extended as illustrated in FIGS. 5, 6A, 6B and 6C so that the gate tab may cover an isolation area of the sub-word line driver SWD. The gate tab may be enlarged so that the gate tab may further cover a boundary portion of an active area of the sub-word line driver SWD, where the boundary portion of the active area is adjacent to the isolation area. When the gate tab is formed to cover the isolation area of the sub-word line driver SWD, a reliability of the sub-word line driver SWD may be increased since an effective length of a channel that is formed under a gate region at a boundary between the gate region and the isolation area is increased.

The sense amplifier area SAs includes a plurality of sense amplifiers. The plurality of sense amplifiers may read and amplify data stored in memory cells MC, or may amplify data to be written into memory cells MC and provide bit lines with the amplified data. The sense amplifier area SAs may further include latches that temporarily store data that are read from memory cells MC or data that are to be written into memory cells MC. Also the sense amplifier area SAs may further include equalizers that precharge and/or equalize a bit line pair BL and BLB.

In the conjunction area CNJ, the sub-word line drive signal PXjD is electrically connected to a respective sub-word line driver SWD. The sub-word line drive signal PXjD may be activated based on a row address by an address decoder. For example, the sub-word line drive signal PXjD may be provided to a j-th sub-word line driver SWD that is selected based on the row address.

The semiconductor memory device may further include a host interface unit, a control unit, an address decoder and a peripheral circuit.

The host interface unit may communicate with external devices (e.g., host device) using various interface protocols, such as Universal Serial Bus (USB), Multi-Media Card (MMC), PCI-E, Serial Advanced Technology Attachment (SATA), Parallel Advanced Technology Attachment (PATA), Small Computer System Interface (SCSI), Enhanced Small Disk Interface (ESDI), Integrated Drive Electronics (IDE), and etc, to receive a command or to output data. The host interface unit may convert the received data into data having an appropriate formation for an internal circuit of the semiconductor memory device, and provide the control unit with the converted command.

The control unit may generate an operation mode signal and an address signal used in reading or writing data.

The address decoder may include a row decoder and a column decoder that receive the address signal from the control unit. The row decoder may generate the word line enable signal WLEi and the sub-word line drive signal PXjD, and provide the sub-word line driver SWD with the word line enable signal WLEi and the sub-word line drive signal PXjD. In such hierarchical configuration of a word line as illustrated in FIG. 1, a plurality of the sub-word line drivers SWD coupled to the same main word line MWL are selected in response to the word line enable signal WLEi, and then one sub-word line is selected among a plurality of sub-word lines SWL in response to the sub-word line drive signals PXjD (e.g., j=0, 1, 2, . . . , 7).

The row decoder may further generate a sub-word line disable signal PXjB, which is complementary to the sub-word line drive signal PXjD, based on the row address. The row decoder may provide the sub-word line driver SWD with the sub-word line drive signal PXjD and the sub-word line disable signal PXjB.

Figure 2:
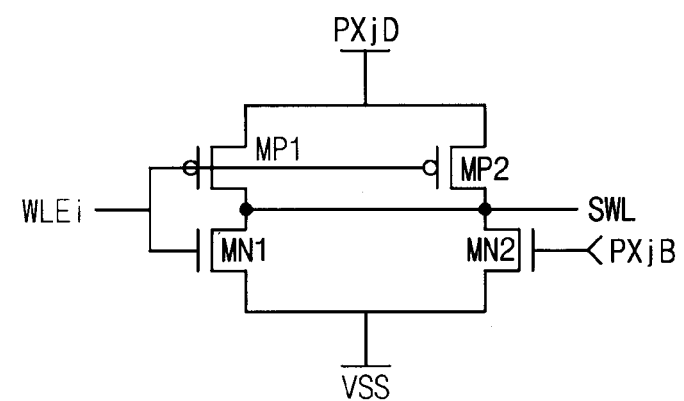
FIG. 2 is a circuit diagram illustrating a sub-word line driver according to example embodiments.

FIG. 2 is a circuit diagram illustrating a sub-word line driver according to example embodiments. The sub-word line driver of FIG. 2 is connected to an i-th main word line and a j-th sub-word line among sub-word lines controlled by the i-th main word line.

Referring to FIG. 2, the sub-word line driver SWD may include a first p-type metal oxide semiconductor (PMOS) transistor MP1, a second PMOS transistor MP2, a first n-type metal oxide semiconductor (NMOS) transistor MN1 and a second NMOS transistor MN2.

Each of the first PMOS transistor MP1 and the second PMOS transistor MP2 includes a souse receiving the sub-word line drive signal PXjD, a gate receiving the word line enable signal WLEi, and a drain connected to a sub-word line SWL. The gates of the first PMOS transistor MP1 and the second PMOS transistor MP2 are connected to a main word line MWL. The word line enable signal WLEi may be applied to the gates of the first PMOS transistor MP1 and the second PMOS transistor MP2 simultaneously.

The first NMOS transistor MN1 includes a source connected to a ground voltage VSS, a gate receiving the word line enable signal WLEi, and a drain connected to the sub-word line SWL. The second NMOS transistor MN2 includes a source connected to the ground voltage VSS, a gate receiving the sub-word line disable signal PXjB, and a drain connected to the sub-word line SWL.

The word line enable signal WLEi may be activated in a logic low level, the sub-word line drive signal PXjD may be activated in a logic high level, and the sub-word line disable signal PXjB may be activated in the logic high level.

The first PMOS transistor MP1 and the second PMOS transistor MP2 may be turned on in response to the word line enable signal WLEi, and provide the sub-word line SWL with the sub-word line drive signal PXjD. When the sub-word line drive signal PXjD is activated based on the row address, the activated sub-word line drive signal PXjD may have a voltage level of the boost voltage VPP. The boost voltage VPP may be generated by pumping a supply voltage VDD, and may be in a higher level than the supply voltage VDD.

The sub-word line disable signal PXjB may be used for decreasing a voltage level of the sub-word line SWL. For example, when the word line enable signal WLEi is deactivated such that the word line enable signal WLEi is in a voltage level higher than a threshold voltage of the first NMOS transistor MN1, the first PMOS transistor MP1 and the second PMOS transistor MP2 are turned off, and the first NMOS transistor MN1 is turned on. Therefore, the voltage level of the sub-word line SWL may be decreased to the ground voltage VSS regardless of the sub-word line disable signal PXjB. However, when the word line enable signal WLEi is activated and the sub-word line drive signal PXjD is deactivated such that the word line enable signal WLEi and the sub-word line drive signal PXjD are in a voltage level of the ground voltage VSS, the first NMOS transistor MN1 is turned off, and the first PMOS transistor MP1 and the second PMOS transistor MP2 are turned on. Therefore, the first PMOS transistor MP1 and the second PMOS transistor MP2 should transfer the sub-word line drive signal PXjD to the sub-word line SWL to decrease the voltage level of the sub-word line SWL to the voltage level of the ground voltage VSS. However, without using the sub-word line disable signal PXjB, the voltage level of the sub-word line SWL may be maintained in a level of a threshold voltage of the first PMOS transistor MP1 and the second PMOS transistor MP2 because of an effect of a coupling between sub-word lines SWL. When the sub-word line disable signal PXjB, which is activated during the sub-word line drive signal PXjD is deactivated, is applied to the gate of the second NMOS transistor MN2, the second NMOS transistor MN2 is turned on, and, therefore, the voltage level of the sub-word line SWL may be decreased to the level of the ground voltage VSS in spite of the coupling between sub-word lines SWL.

The first PMOS transistor MP1 and the second PMOS transistor MP2 may operate as pull-up transistors, and the first NMOS transistor MN1 and the second NMOS transistor MN2 may operate as pull-down transistors.

When a particular sub-word line SWL is selected repeatedly, the boost voltage of a high level may be repeatedly applied to source regions of the first PMOS transistor MP1 and the second PMOS transistor MP2. In this case, the source regions of the first PMOS transistor MP1 and the second PMOS transistor MP2 may be degraded. In addition, hot carrier may be generated because of an abrupt increase of electrons passing through a channel that is formed at the active area under a gate region, and a short channel effect may be caused. According to example embodiments, in order to decrease the degradation and increase a reliability of the sub-word line driver SWD, a gate tab may be formed to be extended in a direction along which the isolation area is formed so that the gate tab may cover an isolation area between the gate regions of the first PMOS transistor MP1 and the second PMOS transistor MP2. The first PMOS transistor MP1 and the second PMOS transistor MP2 included in one sub-word line driver SWD may be a PMOS transistor pair. The gate tabs may be formed to be spaced apart from each other so that the PMOS transistor pairs are separated from each other.

Figure 3:
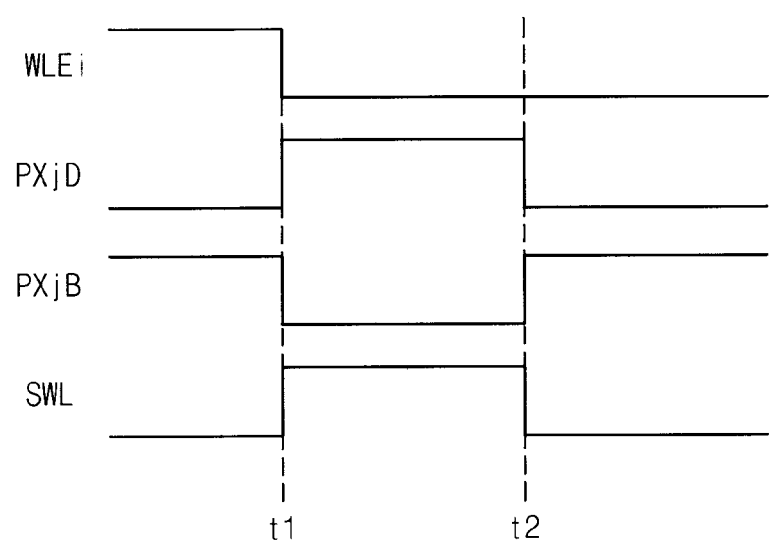
FIG. 3 is a diagram for describing an operation of a sub-word line driver of FIG. 2.

FIG. 3 is a diagram for describing an operation of a sub-word line driver of FIG. 2.

At a time of t1, the i-th main word line MWL and the j-th sub-word line SWL is selected based on a row address corresponding to memory cells. That is, the word line enable signal WLEi and the sub-word line drive signal PXjD, which correspond to the j-th sub-word line SWL, are activated, and the sub-word line disable signal PXjB, which corresponds to the j-th sub-word line SWL, is deactivated at the time of t1. The word line enable signal WLEi may be activated in a logic low level, the sub-word line drive signal PXjD may be activated in a logic high level, and the sub-word line disable signal PXjB may be activated in the logic high level.

Therefore, at the time of t1, the first PMOS transistor MP1 and the second PMOS transistor MP2 of FIG. 2 are turned on in response to the activated word line enable signal WLEi, the first NMOS transistor MN1 of FIG. 2 is turned off in response to the activated word line enable signal WLEi, and the second NMOS transistor MN2 of FIG. 2 is turned off in response to the deactivated sub-word line disable signal PXjB so that the activated sub-word line drive signal PXjD is provided to the j-th sub-word line SWL to increase a voltage level of the j-th sub-word line SWL. When the voltage level of the j-th sub-word line SWL is increased, data may be read from the memory cell connected to the j-th sub-word line SWL or data may be written into the memory cell connected to the j-th sub-word line SWL.

At a time of t2, another sub-word line SWL, which is controlled by the i-th main word line and is different from the j-th sub-word line SWL, is selected by a row address. The word line enable signal WLEi is maintained in the logic low level, but the sub-word line drive signal PXjD is changed to the logic low level and the sub-word line disable signal PXjB is changed to the logic high level.

Therefore, although the first PMOS transistor MP1 and the second PMOS transistor MP2 are maintained to be turned on, the voltage level of the j-th sub-word line SWL is decreased to the level of the ground voltage VSS since the sub-word line drive signal PXjD is in the logic low level and the second NMOS transistor MN2 is turned on by the activated sub-word line disable signal PXjB.

Figure 4:
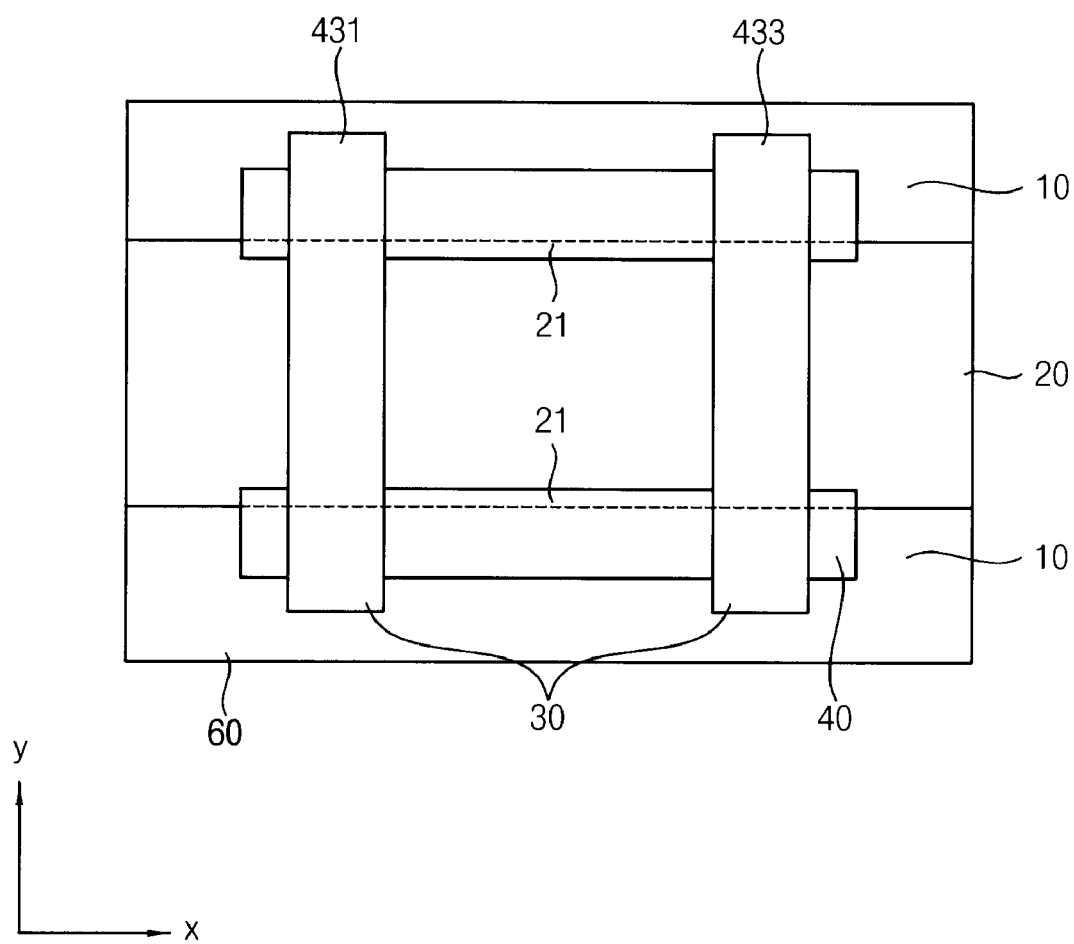
FIG. 4 is a diagram illustrating a schematic layout of a sub-word line driver according to example embodiments.

FIG. 4 is a diagram illustrating a schematic layout of a sub-word line driver according to example embodiments.

The sub-word line driver may include transistors as illustrated in FIG. 2. The transistors are integrated in and on a semiconductor substrate 60. The semiconductor substrate 60 includes an active area 20 and an isolation area 10 for partitioning the active area 20. A source and a drain of a transistor are formed in an active area 20 in the semiconductor substrate 60 and a gate of the transistor is formed in at least one gate region 30 on the semiconductor substrate 60. Further, at least one gate tab 40 is formed to cover the isolation area 10 according to example embodiments. For example, the transistors may be the first PMOS transistor MP1 and the second PMOS transistor MP2 of FIG. 2, which operate as pull-up transistors.

The isolation area 10 may be formed on the semiconductor substrate 60 to be extended in a first direction by a shallow trench isolation (STI) process. The STI process may be used for isolating a plurality of transistors having a narrow channel width since the STI process satisfies a design rule of semiconductor memory devices having a high integration degree. A trench may be formed on the semiconductor substrate 60 in the first direction, and the trench may be filled with an insulation material to form the isolation area 10.

The semiconductor substrate 60 may include the isolation area 10 extended in the first direction and the active area 20 separated from the isolation area 10. The semiconductor substrate 60 may include a silicon substrate, a germanium substrate, a silicon-germanium substrate, a silicon-on-insulator (SOI) substrate, or a germanium-on-insulator (GOI) substrate. The isolation area 10 may be formed by a local oxidation of silicon (LOCOS) process. In the LOCOS process, a thermal oxidation layer is formed in an area of the semiconductor substrate 60 on which a silicon nitride layer is not covered in order to form the isolation area 10.

The active area 20 may be defined as all area of the semiconductor substrate 60 except the isolation area 10. Therefore, the active area 20 may be formed to be extended in the first direction that is the same direction along which the isolation area 10 is extended. A source region and a drain region may be formed in the active area 20. In a PMOS transistor, the active area 20 may correspond to an n-type substrate or an n-type well area formed in a p-type substrate, and the source region and the drain region may correspond to a p-type impurity region. The gate region 30 may be formed on the semiconductor substrate 60 to be extended in a second direction perpendicular to the first direction, so that the gate region 30 may cross the isolation area 10 and the active area 20. For example, the first direction may be a direction of an x-axis of FIG. 4 and the second direction may be a direction of a y-axis of FIG. 4. The gate region 30 may include a first gate line 431 and a second gate line 433. The first gate line 431 may be included in the first PMOS transistor MP1 of FIG. 2 and the second gate line 433 may be included in the second PMOS transistor MP2 of FIG. 2. Same word line enable signal WLEi may be applied to the first gate line 431 and the second gate line 433 simultaneously.

In some example embodiments, the first gate line 431 and the second gate line 433 may form a ring structure such that each end of the first gate line and the second gate line are extended on the isolation area 10 in the first direction to be connected to each other.

The gate region 30 may be formed by forming a gate insulation layer, a gate conduction layer and a gate mask layer in that order, and then patterning the gate mask layer, the gate electrode and the gate insulation layer. The gate electrode may be formed into a single layer including a doped polysilicon layer, a metal layer or a conductive metal nitride layer. Alternatively, the gate electrode may be formed into a multi-layer structure including the doped polysilicon layer, the metal layer or the conductive metal nitride layer. The gate mask layer may be formed using a material having an etching selectivity with respect to the gate electrode and the gate insulation layer.

Electrons and holes that pass through a channel, which is formed under the gate region 30, based on a voltage difference between a voltage applied to the source region in the active area 20 and a voltage applied to the drain region in the active area 20 may be generated as an electron hole pair (EHP) in a portion that is adjacent to a boundary between the gate region 30 and the isolation area 10. When a relatively high voltage such as the boost voltage is applied to the source region, many EHPs may be generated in an instance. Electrons included in the generated EHPs may flow along a boundary between the insulation area 10 and the active area 20 as a hot carrier to increase a standby current and to decrease a drive current, which indicates degradation of the transistors.

In addition, a short channel effect may be caused by the hot carrier. The shot channel effect represents a phenomenon that an effective channel length is shortened since an electron hole pair is coupled together around a boundary of a channel. A threshold voltage of the transistor may be changed because of the short channel effect so that turning on and turning off operations of the transistor may not be performed correctly. Therefore, the boost voltage VPP may not be transferred to the sub-word line SWL correctly. Furthermore, a characteristic of the transistor may be degraded because of a leakage current. To increase an effective length of a channel in a portion that is adjacent to the boundary between the gate region 30 and the isolation area 10, the gate tab 40 may be formed to be extended in the first direction according to example embodiments.

The gate tab 40 may be formed on the semiconductor substrate 60, where the gate tab 40 is extended in the first direction to cover the isolation area 10. In some example embodiments, the gate tab 40 may be enlarged in the second direction to further cover a boundary portion 21 of the active area 20, where the boundary portion 21 is adjacent to the isolation area 10.

For example, the gate tab 40 may be formed on the semiconductor substrate 60 to be extended in the first direction so that the gate tab 40 may cover all of the isolation area 10 between the first gate line 431 and the second gate line 433 and the boundary portion 21 of the active area 20, where the boundary portion 21 is adjacent to the isolation area 10 between the first gate line 431 and the second gate line 433. At least one gate tab 40 may be arranged in the second direction.

The gate tab 40 may prevent a decrease of a reliability of the transistor, which is caused by a hot electron induced punch through (HEIP) effect, by increasing an effective length of a channel that is formed at a boundary between the gate region 30 and the isolation area 10.

Figure 5:
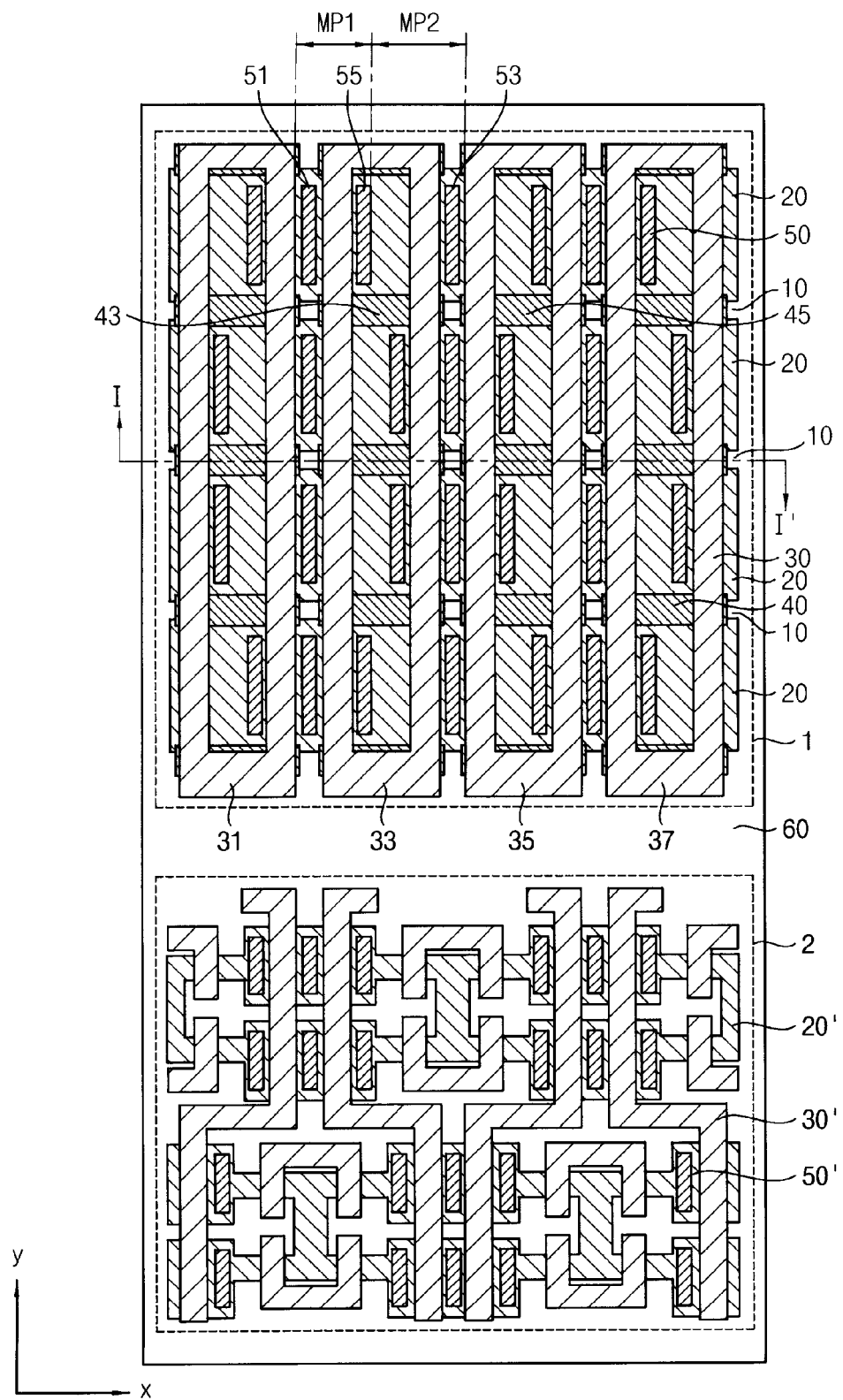
FIG. 5 is a top view of a sub-word line driver circuit according to example embodiments.

FIG. 5 is a top view of a sub-word line driver circuit according to example embodiments.

Sixteen sub-word line drivers are illustrated in FIG. 5. Each of the sixteen sub-word line drivers may include two transistors formed in a pull-up transistor area 1 and two transistors formed in a pull-down transistor area 2. The pull-up transistor area 1 and the pull-down transistor area 2 may be included in a same semiconductor substrate 60. The pull-up transistor area 1 may include at least one PMOS transistor, and the pull-down transistor area 2 may include at least one NMOS transistor. In example embodiments of FIG. 5, the pull-up transistor area 1 includes thirty two PMOS transistors, and the pull-down transistor area 2 includes thirty two NMOS transistors.

Referring to FIG. 5, the semiconductor substrate 60 may include a plurality of isolation areas 10 and a plurality of active areas 20, where the two consecutive active areas are separated by each isolation area 10, and the isolation areas 10 and the active areas 20 are extended in a first direction and are arranged in a second direction perpendicular to the first direction. The first direction may be a direction of an x-axis of FIG. 5 and the second direction may be a direction of a y-axis of FIG. 5. The isolation areas 10 and the active areas 20 may be arranged alternately. For example, the isolation areas 10 and the active areas 20 may be arranged alternately in the second direction The sub-word line drive signal PXjD may be applied to source regions 51 and 53 of the first PMOS transistor MP1 and the second PMOS transistor MP2 that are formed in the active area 20. When the sub-word line drive signal PXjD having a voltage level of the boost voltage VPP is applied to the source regions 51 and 53 repeatedly based on the row address, the short channel effect may be caused by an abrupt increase of electron hole pairs that is generated in a channel formed between the source regions 51 and 53 and a drain region 55 in the first direction, and the first PMOS transistor MP1 and the second PMOS transistor MP2 may be degraded since many electrons flow in an instance along a boundary between the gate region 30 and the insulation area 10.

The gate region 30 may include a plurality of gate lines formed on the semiconductor substrate 60, where the gate lines are extended in the second direction and are arranged in the first direction. In some example embodiments, as illustrated in FIG. 5, when a plurality of the sub-word line drivers are formed on the semiconductor substrate 60, two gate lines, which are connected to a same main word line MWL and receive a same word line enable signal WLEi simultaneously, may form a ring structure such that each end of the two gate lines are extended on the isolation areas 10 in the first direction to be connected to each other. In FIG. 5, each of gate regions 31, 33, 35 and 37 includes two gate lines and has a ring structure. Each of the gate regions 31, 33, 35 and 37 is common to eight PMOS transistors, respectively, to provide the eight PMOS transistors with a same word line enable signal WLEi simultaneously.

At least one gate tab 40 may be formed on the semiconductor substrate 60, where the at least one gate tab 40 is extended in the first direction to cover the isolation area 10. Each of the gate regions 31, 33, 35 and 37 may include a gate line pair extended in the second direction. The at least one gate tab 40 may be formed to cover all of the isolation area 10 between the gate line pair. The at least one gate tab 40 may be enlarged in the second direction to further cover a boundary portion of the active area 20 between the gate line pair, where the boundary portion is adjacent to the isolation area 10. The at least one gate tab 40 may include a plurality of gate tabs 40 that are arranged in the second direction, and each gate tab 40 may cover each isolation area 10 between the gate line pair. Thereby, effective lengths of channels, which are formed under the gate regions 31, 33, 35 and 37 at boundaries between the gate regions 31, 33, 35 and 37 and the isolation areas 10, are increased. The gate tabs 40 may be attached to the gate region 30.

For example, the gate region 33 may include a first gate line pair having a first gate line and a second gate line that are extended in the second direction, and the gate region 35 may include a second gate line pair having a third gate line and a fourth gate line that are extended in the second direction. The first gate line, the second line, the third gate line and the fourth gate line may be arranged consecutively in the first direction. The first gate line and the second gate line may receive a first word line enable signal simultaneously, and the third gate line and the fourth gate line may receive a second word line enable signal simultaneously. A first gate tab 43 may be formed to cover all of the isolation area 10 between the first gate line and the second gate line, and a second gate tab 45 may be formed to cover all of the isolation area 10 between the third gate line and the fourth gate line. Each of the first gate tab 43 and the second gate tab 45 may include a plurality of gate tabs that are arranged consecutively in the second direction, and each gate tab may cover each isolation area 10 between the first gate line and the second gate line and between the third gate line and the fourth gate line. The first gate tab 43 and the second gate tab 45 may be arranged to be spaced apart from each other in the first direction.

The first gate line and the second gate line may form the gate region 33 having a ring structure such that each end of the first gate line and the second gate line are extended on the isolation areas 10 in the first direction to be connected to each other. The third gate line and the fourth gate line may form the gate region 35 having a ring structure such that each end of the third gate line and the fourth gate line are extended on the isolation areas 10 in the first direction to be connected to each other.

One sub-word line driver may be embodied by connecting drains of the first PMOS transistor MP1 and the second PMOS transistor MP2 to drains of corresponding NMOS transistors. Each of the first PMOS transistor MP1 and the second PMOS transistor MP2 may transfer the sub-word line drive signal PXjD to a respective drain region in response to the word line enable signal WLEi, and the respective drain region may be connected to the sub-word line SWL.

The pull-down transistor area 2 may include an active area 20', a gate region 30' and a source/drain region 50'. The pull-down transistor area 2 may include at least one NMOS transistor. A drain region of the at least one NMOS transistor may be connected to a corresponding drain region of a PMOS transistor to decrease the voltage level of the sub-word line SWL.

The semiconductor substrate 60 may be a p-type substrate, and the active area 20 may be an n-type well area.

When a gate mask pattern is used to form the gate region 30, if the gate tab 40 is formed to surround only a portion of the isolation area 10 adjacent to the gate region 30, a profile at a portion where the gate tab 40 is formed may be easily changed. When the gate tab 40 is formed separately for each PMOS transistor included in a PMOS transistor pair, an effective channel length achieved by the gate tab 40 may be decreased since a portion of the gate tab 40 may be lost during forming the gate tab 40 and separating the gate tab 40. Therefore, when the gate tab 40 is formed to cover all of the isolation area 10 between the gate line pair and a boundary portion of the active area 20 between the gate line pair, where the boundary portion is adjacent to the isolation area 10, a process to form the gate tab 40 may be simplified and the HEIP effect may be reduced.

The gate tabs 40 may be formed to cover all of the isolation areas 10 between the first gate line and the second gate line. The gate tabs 40 may be enlarged in the second direction to further cover a boundary portion of the active areas 20 between the first gate line and the second gate line, where the boundary portion is adjacent to the isolation area 10.

In some example embodiments, a plurality of the gate tabs 40 may be arranged in the second direction. A plurality of the gate tabs 40 may be arranged to be spaced apart from each other in the first direction so that the gate line pairs are separated from each other. The gate tab 40 may be formed to cover all of the isolation area 10 between the gate line pair and a boundary portion of the active area 20, where the boundary portion is adjacent to the isolation area 10. The gate tab 40 may not be formed between the gate regions 31, 33, 35 and 37 so that the gate regions 31, 33, 35 and 37 are separated from each other. Therefore, the gate tab 40 may be formed to cover all of the isolation area 10 at first, and then the gate tab 40 may be etched so that the gate regions 31, 33, 35 and 37 may be separated from each other. Alternatively, the gate tab 40 may be formed using a gate tab mask pattern that is designed for separating the gate regions 31, 33, 35 and 37 from each other. Referring to FIG. 5, the first gate tab 43 and the second gate tab 45 may be arranged to be spaced apart from each other in the first direction so that the gate regions 33 and 35 are electrically separated from each other.

Figure 6A:
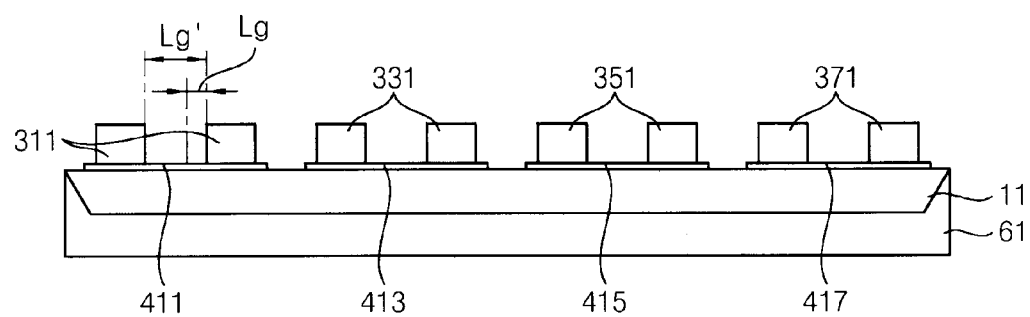
FIGS. 6A, 6B and 6C are cross-sectional views of examples of gate tabs taken along a line I-I' of FIG. 5.
Figure 6B:
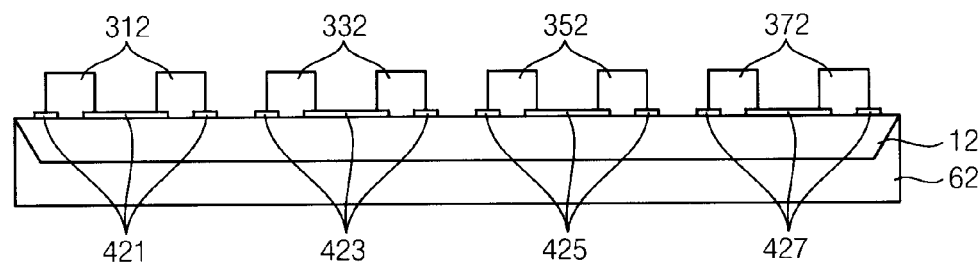
Figure 6C:
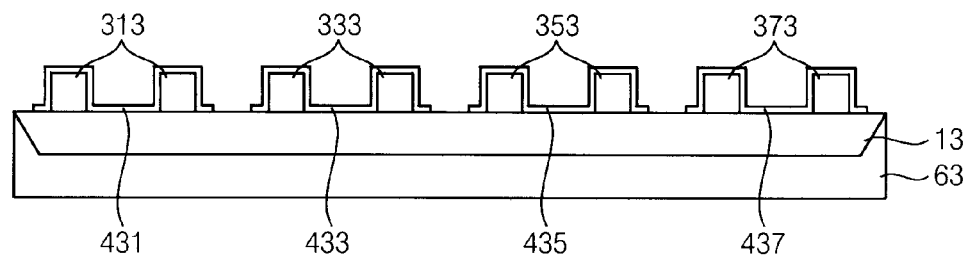

FIGS. 6A, 6B and 6C are cross-sectional views of examples of gate tabs taken along a line I-I' of FIG. 5.

FIG. 6A represents a cross-sectional view of the sub-word line driver which is made by forming gate tabs 411, 413, 415 and 417 on an isolation area 11, which is formed on a semiconductor substrate 61, and then forming gate regions 311, 331, 351 and 371.

Each of the gate tabs 411, 413, 415 and 417 may be formed for each of the gate regions 311, 331, 351 and 371, respectively, so that a gate extension length may be a maximum. The gate extension length Lg' and Lg may correspond to an increased effective channel length by a gate tab. When the gate tabs 411, 413, 415 and 417 have a first gate extension length Lg', the gate tabs 411, 413, 415 and 417 may be formed more easily and effective channel length may be more increased compared with a case when the gate tabs 411, 413, 415 and 417 have a second gate extension length Lg. For example, when one gate tab is formed for one corresponding gate region (i.e., four gate tabs 411, 413, 415 and 417 are formed for the four gate regions 311, 331, 351 and 371, respectively), the gate tabs 411, 413, 415 and 417 may be formed using a simpler gate tab mask pattern compared with a case when one gate tab is formed for each gate line (i.e., eight gate tabs are formed for eight gate lines included in the four gate regions 311, 331, 351 and 371).

FIG. 6B represents a cross-sectional view of the sub-word line driver which is made by forming gate tabs 421, 423, 425 and 427 on an isolation area 12, which is formed on a semiconductor substrate 62, and then forming gate regions 312, 332, 352 and 372.

The gate tabs 421, 423, 425 and 427 may be formed on the isolation area 12, a portion of the gate tabs 421, 423, 425 and 427 on which the gate regions 312, 332, 352 and 372 is formed, respectively, may be eliminated, and then the gate regions 312, 332, 352 and 372 may be formed.

In some example embodiments, the gate regions 312, 332, 352 and 372 may be formed at first, and then the gate tabs 421, 423, 425 and 427 may be formed using a gate tab mask pattern designed for covering the isolation area 12 except for a portion of the isolation area 12 on which the gate regions 312, 332, 352 and 372 are formed.

FIG. 6C represents a cross-sectional view of the sub-word line driver which is made by forming gate regions 313, 333, 353 and 373 on an isolation area 13, which is formed on a semiconductor substrate 63, and then forming gate tabs 431, 433, 435 and 437.

The gate tabs 431, 433, 435 and 437 may be formed to cover portions of both side walls and upper surface of the gate regions 313, 333, 353 and 373, respectively, where the portions are adjacent to a boundary between the gate regions 313, 333, 353 and 373 and the isolation area 13.

The sub-word line drivers illustrated in FIGS. 6A, 6B and 6C may have a maximum gate extension length since two gate lines that are included in one gate region of a PMOS transistor pair is connected to each other by one gate tab. Although the gate tabs are illustrated to be formed on the isolation areas 11, 12 and 13 in FIGS. 6A, 6B and 6C, the gate tabs may be enlarged in the second direction, as illustrated in FIG. 5, to further cover a boundary portions of the active areas, where the boundary portions are adjacent to the isolation areas 11, 12 and 13, respectively.

Figure 7A:
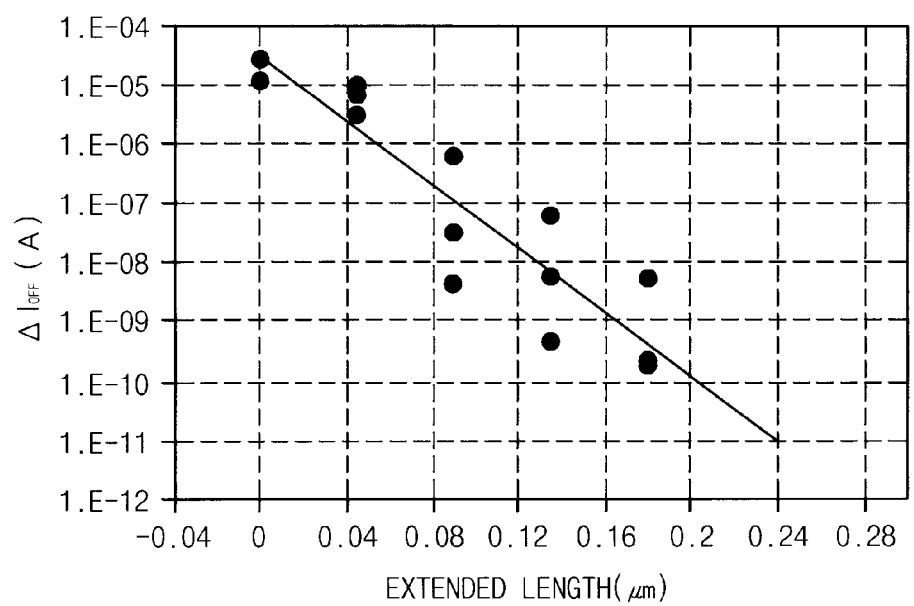
FIGS. 7A and 7B are graphs for describing a hot electron induced punch through (HEIP) effect in relation with a gate extension length.
Figure 7B:
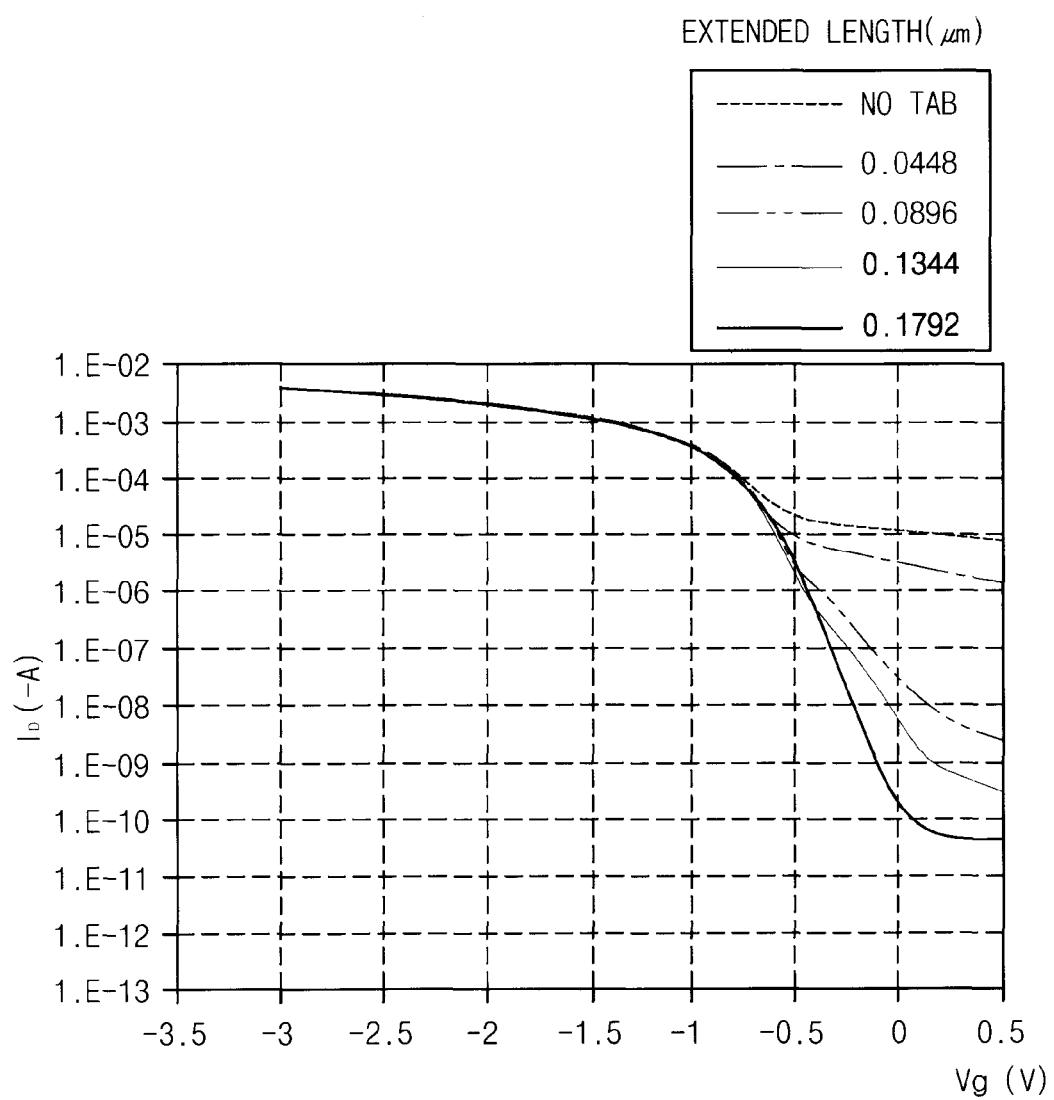

FIGS. 7A and 7B are graphs for describing a HEIP effect in relation with a gate extension length.

FIGS. 7A and 7B represent degradation characteristics of a transistor included in the sub-word line driver when a voltage of −4.5V is applied to the sub-word line driver for 1000 seconds.

A relation between the gate extension length and a standby current Ioff is illustrated in FIG. 7A.

Referring to FIG. 7A, as the gate extension length increases, a variation in the standby current Ioff decreases.

The standby current Ioff may be caused by a leakage current in a standby state of a PMOS transistor in which the PMOS transistor is turned off since a threshold voltage of the PMOS transistor is changed because of electrons trapped around the gate region adjacent to a boundary between the active area and the isolation area, or caused by a flow of the trapped electrons along a boundary between the isolation area and the gate region. When a length of the gate tab is relatively long, a number of the trapped electrons may be deceased and an effective channel length may be increased so that a short channel effect is prevented to reduce a change of the threshold voltage of the PMOS transistor. It is advantageous for the gate extension length to be a maximum under a design rule since as the gate extension length increases, a variation of the standby current decreases. According to example embodiments, the gate extension length is a maximum since the gate tab is formed to cover all of the isolation area between a gate line pair and a boundary portion of the active area between the gate line pair, where the boundary portion is adjacent to the isolation area. Therefore, the standby current may decrease.

A relation between a gate voltage Vg and a drain current Id is illustrated in FIG. 7B. FIG. 7B represents a current characteristic in relation with a gate extension length when the gate voltage Vg is under a threshold voltage of a PMOS transistor.

The gate voltage Vg may correspond to a voltage level of the word line enable signal WLEi. The gate voltage Vg may be applied to a gate line pair simultaneously. When the gate voltage Vg becomes a level of a threshold voltage of the PMOS transistor, the PMOS transistor may be turned on. A characteristic of the drain current is illustrated in FIG. 7B when the gate voltage Vg is under the threshold voltage.

The STI process may be used in a semiconductor memory device having a high integration degree since a trench occupies a relatively small space and a performance in isolating a plurality of transistors is relatively good. However, when a transistor is formed by the STI process, a channel may be formed at a boundary between the active area and the isolation area even when the transistor is turned off since electric field around an edge of the trench is strong. That is, a hump phenomenon may occur.

When a gate tab is not formed and thereby an effective channel length is relatively short, a short channel effect may be caused by a HEIP effect and a current may flow when the gate voltage is smaller than the threshold voltage. That is, the hump phenomenon may occur. However, when a gate tab is formed and thereby an effective channel length is relatively long, a current that flows when the gate voltage is smaller than the threshold voltage, which is detected as the drain current, may be reduced, and a ratio of a variation of the gate voltage to a variation of the drain current (i.e., a subthreshold swing) may be decreased when the gate voltage is smaller than the threshold voltage.

The subthreshold swing may be represented by equation 1.

$$S = Vg/(\log Id) \qquad \text{[equation 1]}$$

S represents the subthreshold swing, Vg represents the gate voltage and Id represents the drain current.

As illustrated in FIG. 7B, when the gate voltage is changed from −0.5V to 0V, as the gate extension length increases, the subthreshold swing decreases since a variation of the drain current increases.

Power consumption in the standby state is determined based on the subthreshold swing when the gate voltage is smaller than the threshold voltage. Therefore, if the subthreshold swing decreases when the gate voltage is smaller than the threshold voltage, power consumption of the PMOS transistor may be reduced.

Since the sub-word line driver according to example embodiments includes the gate tab that is formed to cover all of the isolation area between the gate line pair, incorrect operation of the sub-word line driver, which is caused by applying the boost voltage to the sub-word line driver repeatedly, may be prevented, and a power consumption of the sub-word line driver may be reduced by decreasing the standby current.

Example embodiments may be used in a semiconductor device including a transistor that transfer a voltage, and a mobile electronic device having a high integration degree.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A sub-word line driver circuit comprising:
   a substrate including a plurality of isolation areas and a plurality of active areas, the two consecutive active areas being separated by each isolation area, the isolation areas and the active areas being extended in a first direction and being arranged in a second direction perpendicular to the first direction;
   a plurality of gate lines formed on the substrate, the gate lines being extended in the second direction and being arranged in the first direction; and
   at least one gate tab formed on the substrate, the at least one gate tab being extended in the first direction to cover the isolation area.

2. The sub-word line driver circuit of claim 1, wherein the at least one gate tab is enlarged in the second direction to further cover a boundary portion of the active area, the boundary portion being adjacent to the isolation area.

3. The sub-word line driver circuit of claim 1, wherein the gate lines include a first gate line and a second gate line that are arranged consecutively in the first direction, the first gate line and the second gate line receiving a gate voltage simultaneously, and
   wherein the at least one gate tab is formed to cover all of the isolation area between the first gate line and the second gate line.

4. The sub-word line driver circuit of claim 3, wherein the at least one gate tab is enlarged in the second direction to further cover a boundary portion of the active area between the first gate line and the second gate line, the boundary portion being adjacent to the isolation area.

5. The sub-word line driver circuit of claim 3, wherein the at least one gate tab includes a plurality of gate tabs that are arranged in the second direction, each gate tab covering each isolation area between the first gate line and the second gate line.

6. The sub-word line driver circuit of claim 3, wherein the first gate line and the second gate line form a ring structure such that each end of the first gate line and the second gate line are extended on the isolation areas in the first direction to be connected to each other.

7. The sub-word line driver circuit of claim 1, wherein the gate lines include a first gate line, a second gate line, a third gate line and a fourth gate line that are arranged consecutively in the first direction, the first gate line and the second gate line receiving a first gate voltage simultaneously, the third gate line and the fourth gate line receiving a second gate voltage simultaneously,
   wherein the at least one gate tab includes a first gate tab and a second gate tab, the first gate tab being formed to cover all of the isolation area between the first gate line and the second gate line, the second gate tab being formed to cover all of the isolation area between the third gate line and the fourth gate line.

8. The sub-word line driver circuit of claim 7, wherein the first gate tab and the second gate tab are enlarged in the second direction to further cover boundary portions of the active areas between the first gate line and the second gate line and between the third gate line and the fourth gate line, the boundary portions being adjacent to the isolation areas.

9. The sub-word line driver circuit of claim 7, wherein each of the first gate tab and the second gate tab includes a plurality of gate tabs that are arranged consecutively in the second direction, each gate tab covering each isolation area between the first gate line and the second gate line and between the third gate line and the fourth gate line.

10. The sub-word line driver circuit of claim 7, wherein the first gate tab and the second gate tab are arranged to be spaced apart from each other in the first direction.

11. The sub-word line driver circuit of claim 7, wherein the first gate line and the second gate line form a ring structure such that each end of the first gate line and the second gate line are extended on the isolation areas in the first direction to be connected to each other, and
    wherein the third gate line and the fourth gate line form a ring structure such that each end of the third gate line and the fourth gate line are extended on the isolation areas in the first direction to be connected to each other.

12. The sub-word line driver circuit of claim 1, wherein a source region and a drain region are formed in the active area, a sub-word line drive signal being applied to the source region, a word line enable signal being applied to the gate line, the drain region being connected to a sub-word line.

13. A semiconductor memory device, comprising:
    a sub-word line driver circuit configured to provide a sub-word line with a sub-word line drive signal in response to a word line enable signal; and
    a memory cell array including a plurality of memory cells, each of the plurality of the memory cells being connected to the sub-word line and a bit line,
    wherein the sub-word line driver circuit includes:
      a substrate including a plurality of isolation areas and a plurality of active areas, the two consecutive active areas being separated by each isolation area, the isolation areas and the active areas being extended in a first direction and being arranged in a second direction perpendicular to the first direction;
      a plurality of gate lines formed on the substrate, the gate lines being extended in the second direction and being arranged in the first direction; and
      at least one gate tab formed on the substrate, the at least one gate tab being extended in the first direction to cover the isolation area.

* * * * *